United States Patent [19]

Naarmann et al.

[11] Patent Number: 4,569,734
[45] Date of Patent: Feb. 11, 1986

[54] PREPARATION OF POLYPYRROLES, AND FILMS OBTAINED BY THIS METHOD

[75] Inventors: Herbert Naarmann, Wattenheim; Johann Nickl, Bad Durkheim; Gernot Köhler, Ludwigshafen, all of Fed. Rep. of Germany

[73] Assignee: BASF Aktiengesellschaft, Fed. Rep. of Germany

[21] Appl. No.: 613,350

[22] Filed: May 23, 1984

[30] Foreign Application Priority Data

May 25, 1983 [DE] Fed. Rep. of Germany ....... 3318857

[51] Int. Cl.$^4$ .............................................. C25B 3/02
[52] U.S. Cl. ...................................................... 204/78
[58] Field of Search ..................... 204/78, 72; 548/564

[56] References Cited

U.S. PATENT DOCUMENTS 3,574,072  4/1971  Louvar ................................. 204/72
4,401,545  8/1983  Naarmann et al. ................. 204/291

*Primary Examiner*—R. L. Andrews
*Attorney, Agent, or Firm*—Keil & Weinkauf

[57] ABSTRACT

Polypyrroles are prepared by electrochemical polymerization, in particular anodic oxidation, of pyrrole alone or together with comonomers, in an aqueous electrolyte solvent which consists of not less than 50% by weight of water, in the presence of aromatic sulfonic acids and/or their salts as conductive salts. The process gives polypyrrole films which have good mechanical properties and high electrical conductivities.

9 Claims, No Drawings

PREPARATION OF POLYPYRROLES, AND FILMS OBTAINED BY THIS METHOD

The present invention relates to a process for the preparation of polypyrroles by electrochemical polymerization, in particular anodic oxidation, of pyrrole or a mixture of pyrrole with other comonomers in an aqueous electrolyte solvent in the presence of a conductive salt, with deposition of the polypyrroles on the anode, which is preferably a sheet-like structure.

It is known that pyrrole polymer films can be prepared by anodic oxidation of pyrrole or a substituted pyrrole in a polar organic electrolyte solvent in the presence of a conductive salt. The resulting polypyrrole films have an electrical conductivity as high as about $10^2 \, \Omega^{-1} cm^{-1}$ (cf. for example J. Chem. Soc. Chem. Comm. 1979, page 635; ibid., page 854; or DE-A 30 49 551). The disadvantage of this process is that organic solvents, e.g. acetonitrile, are used, although it is stated that small amounts of water, e.g. as much as 3% by weight, can be added to the electrolyte solvent to increase the electrical conductivity.

The electrochemical polymerization of 5-membered and 6-membered heterocyclic compounds is also described in U.S. Pat. No. 3,574,072. The electrolysis takes place in an organic solvent and an alkaline medium, in particular an aqueous alkaline medium. According to the examples of the stated patent, the amount of water in the electrolyte solvent is not more than 25% by weight, based on the electrolyte solvent. Attempts to replace some or all of the organic electrolyte solvent by water resulted in lowquality products. In particular, it was impossible to obtain satisfactory, cohesive polymer films.

Recently, the polypyrroles have become particularly important as highly electrically conductive polymer systems. Where they are to be used in the electrical industry for semiconductor components, switches, screening materials or solar cells, it is frequently advantageous if the polypyrroles can be obtained and used in the form of films.

It is an object of the present invention to provide a process for the preparation of polypyrroles which is simple to carry out in predominantly aqueous systems, in particular water itself, allows the use of organic solvents to be substantially or completely dispensed with, and permits highly electrically conductive polypyrrole films having good mechanical properties to be prepared in a selective and reproducible manner.

We have found, surprisingly, that this object is achieved by a process in which pyrrole, in the presence or absence of comonomers, is electrochemically oxidized and polymerized in a predominantly aqueous electrolyte solvent in the presence of aromatic sulfonic acids and/or their salts as conductive salts.

The present invention accordingly relates to a process for the preparation of polypyrroles by electrochemical polymerization, in particular anodic oxidation, of pyrrole or a pyrrole-comonomer mixture in a water-containing electrolyte solvent in the presence of a conductive salt, with deposition of the polypyrrole on the anode, which is preferably sheet-like, wherein the said electrochemical polymerization is carried out in an aqueous electrolyte solvent which consists of not less than 50, preferably not less than 80, % by weight of water, aromatic sulfonic acids and/or their salts being used as conductive salts.

Although salts of aromatic sulfonic acids have already been used as conductive salts in the electrochemical polymerization of pyrrole in organic electrolyte solvents (cf. for example DE-A 30 49 551), it was extremely surprising that the use of the said salts in the electrochemical polymerization of pyrrole in water gave highly electrically conductive polymer films of good quality and with good mechanical properties, without the addition of any assistants, e.g. dispersants, being necessary. This is all the more valid since, when the reaction is carried out in a predominantly aqueous electrolyte system, the other conventional, and even preferred, conductive salts for the electrochemical polymerization of pyrrole in organic solvents give completely unsatisfactory products or, for example, have to be used together with dispersants if polymer films are to be obtained. Unexpectedly, the properties of the polypyrrole films prepared according to the invention are far superior to those of other polypyrroles prepared in an aqueous electrolyte system by an electrochemical method. The novel process permits polypyrrole films to be prepared in any desired size and thickness by a simple and reproducible procedure, the products obtained generally being highly electrically conductive, with electrical conductivities in general above $10^0 \, \Omega^{-1} cm^{-1}$.

Pyrrole is preferably used as the sole monomer in the process according to the invention. However, a mixture of pyrrole with comonomers can also be used, the amount of comonomers preferably being not more than 25% by weight, based on the total amount of monomers. Particularly suitable comonomers are other heteroaromatics, or aromatic compounds. Examples of heteroaromatic comonomers are pyrroles which are substituted at the carbon atoms, in particular the monoalkyl-, dialkyl-, monohalogen- and dihalogen-substituted pyrroles, e.g. the 3,4-dialkylpyrroles, in particular those where alkyl is 1 to 4 carbon atoms, such as 3,4-dimethylpyrrole and 3,4-diethylpyrrole, and the 3,4-dihalopyrroles, such as 3,4-dichloropyrrole. Other heteroaromatic comonomers are, in particular, furan and thiophene. Particularly suitable aromatic comonomers are the linear fused polynuclear aromatics, such as anthracene, tetracene, pentacene, etc.

Accordingly, for the purposes of the present invention, polypyrroles are homopolymers and copolymers of pyrrole.

In accordance with the invention, the electrochemical polymerization of the pyrrole or of the mixture of pyrrole with the comonomers is carried out in an electrolyte solvent system which consists predominantly of water. Preferably, water alone is used as the electrolyte solvent. To improve the dispersibility of the monomers, particularly when aromatic comonomers are present, or to improve the solubility of the conductive salt used, minor amounts of organic solvents may also be added to the water. When used as electrolyte solvents in the novel process, such solutions of water with organic solvents should consist of not less than 50, preferably not less than 80, % by weight of water. Particularly suitable organic solvents for addition to the aqueous electrolyte solvent are alcohols, e.g. methanol, ethanol or diethylene glycol, ethers, e.g. tetrahydrofuran, ketones, e.g. acetone, acetonitrile, dimethylformamide, dimethyl sulfoxide, sulfolane, propylene carbonate, etc. Electrolyte solvents which are preferably used in the novel process consist of more than 90% by weight of water, water itself being particularly preferred. Apart from the conductive salts described below, the aqueous electrolyte solvents used in the novel process generally contain no further assistants or additives, e.g. dispersants, even if the addition of such further assistants is in principle permissible.

In the process according to the invention, the monomer concentration is in general from 0.001 to 5 moles, preferably from 0.01 to 1 mole, per liter of electrolyte solvent, but may be above or below these limits.

According to the invention, aromatic sulfonic acids and in particular their salts are used as conductive salts, which, in particular, serve to transport the current in the electrolyte solvent during the electrochemical polymerization but are also contained in the resulting polymer, probably bonded in the form of a complex, and play a part in influencing the properties of the polymer. In general, suitable conductive salts in the novel process are compounds for which the deposition potential of the sulfonate anion is above about 0.8–1 volt, measured against a standard calomel electrode. The aromatic sulfonic acids or the salts of these which are used should be soluble in the aqueous electrolyte solvent. The concentration of the conductive salt is in general from 0.001 to 1, preferably from 0.01 to 0.5, mole per liter of electrolyte solvent.

The aromatic sulfonic acids or salts of these which are employed according to the invention as conductive salts can be derived from a very large variety of monoaromatic or polyaromatic compounds, and can contain one or more sulfonic acid groups, depending on the parent aromatic structure. The aromatic parent compound of the aromatic sulfonic acids, or of their salts, which are used according to the invention can be, in particular, benzene, fused aromatic systems, e.g. naphthalene, anthracene or phenanthrene, other polyaromatic compounds, e.g. polystyrene, linearly linked non-fused oligophenyls or polyphenyls, phenol resins, etc.; or advantageously derivatives of such aromatic systems, e.g. naphthoquinone, anthraquinone or higher fused aromatic quinones. The aromatic parent compounds can contain, in addition to the sulfonic acid groups, one or more other substituents, e.g. halogen atoms, OH groups, nitro groups, unsubstituted or substituted amino groups, alkyl or alkoxy radicals, preferably of 1 to 6 carbon atoms each, or carboxyl groups. In the low molecular weight aromatic sulfonic acid compounds, the number of sulfonic acid groups is generally from 1 to 3, while the corresponding high molecular weight compounds, e.g. polystyrenesulfonic acid, generally contain from one to about 35 sulfonic acid groups per 100 phenyl units in the molecule.

Aromatic sulfonic acids, or salts of these, which are preferably used as conductive salts in the novel process are those which are derived from benzene, naphthalene, anthracene, phenanthrene, polystyrene having a number average mean molecular weight of from 500 to 20,000, naphthoquinone or anthraquinone. Examples of preferably used aromatic sulfonic acids are benzenesulfonic acid, toluenesulfonic acid, sulfosalicylic acid, p-aminobenzenesulfonic acid, p-hydroxybenzenesulfonic acid, benzenesulfonic acid which is substituted by one, two or three nitro groups, N-benzylaminobenzenesulfonic acid, benzenesulfonic acid which is substituted by OH, amino and nitro groups, naphthalenesulfonic acid, naphthalenedisulfonic acid, naphthoquinonesulfonic acid, anthracenesulfonic acid, anthracenedisulfonic acid, anthraquinonesulfonic acid, anthraquinonedisulfonic acid, phenanthrenedisulfonic acid, and naphthalene-, anthracene-, naphthoquinone- or anthraquinone-sulfonic acid which is substituted by the above groups. Among the polymeric aromatic sulfonic acids, polystyrenesulfonic acid is preferred.

Suitable cations for the conductive salts used according to the invention are the alkaline earth metal cations and $H^+$, and in particular the alkali metal cations, preferably $Li^+$, $Na^+$ or $K^+$. Other, very advantageous cations are $NO^+$ and $NO_2^+$, in particular the onium cations, especially those of nitrogen and of phosphorus, for example those of the $R_4N^+$ and $R_4P^+$ type, where the radicals R independently of one another are each hydrogen, a lower alkyl radical, or a cycloaliphatic or aromatic radical. Preferred onium cations are the tertiary and quaternary ammonium and phosphonium cations, in particular those in which R is alkyl of 1 to 6 carbon atoms.

In accordance with the invention, in addition to the aromatic sulfonic acids or their salts it is also possible concomitantly to use other conventional conductive salts, e.g. tetrafluoborates, hexafluoroarsenates, hexafluoroantimonates, hexachloroantimonates, hexafluorophosphates, perchlorates, bisulfates and sulfates. Suitable cations for these conventional conductive salts which may be present are those stated above, in particular the alkali metal cations and the onium cations of nitrogen and of phosphorus. The amount of these conventional conductive salts should be not more than 50% by weight, based on the sum of all conductive salts used. Preferably, the novel process is carried out using the aromatic sulfonic acids or, in particular, their salts as the sole conductive salts.

The novel process can be carried out in the conventional electrolysis cells or electrolysis apparatuses. Examples of very suitable apparatuses are simple electrolysis apparatuses consisting of a cell without a diaphragm and with two electrodes and an external current source. The electrodes can be made of, for example, graphite or a conventional inert electrode material, in particular a noble metal, such as platinum or palladium, stainless steel, nickel or titanium. The resulting polymers are deposited on the anode, so that, in order to prepare polypyrrole films, it is advantageous for the anode, but in particular both electrodes, to be sheet-like structures. The size of the anode surface corresponds to the size of the resulting polypyrrole film. Preferably, the surfaces of the two electrodes are arranged parallel to one another.

Apart from the abovementioned simple electrolysis cells without a diaphragm, it is also possible to use other electrolysis apparatuses for the novel process, for example cells with diaphragms or those containing reference electrodes for accurate determination of the potential. It is often advantageous to measure the amount of current (A sec), since this permits, inter alia, monitoring of the thickness of the deposited film.

The novel process is usually carried out at room temperature. However, since the reaction temperature has proven not to be critical, it can be varied within a wide range, provided that it does not fall below the solidification temperature of the electrolyte solvent or exceed the boiling point of this solvent. In general, a polymerization temperature of from 0° to 5020 C., in particular from +10° to +30° C., has proven very advantageous.

Any d.c. current source, e.g. a battery which delivers a sufficiently high electrical voltage, is a suitable current source for operating the electrolysis cell in which the novel process is carried out. The electrochemical polymerization according to the invention is usually carried out using a voltage of from 0.1 to 100, preferably from 1.5 to 25 volt. An advantageous current density in the novel process is from 0.05 to 20, preferably from 1 to 10, mA/cm$^2$.

Factors on which the duration of the electrolysis depends include the electrolyte system used, the particular electrolysis conditions and in particular the film thickness desired. Usually, the electrolysis takes from 30 minutes to several hours. For example, films up to 70 μm thick can readily be obtained in the course of one hour, so that films more than 100 μm thick can be prepared in the course of a few hours, e.g. from 2 to 4 hours.

The polypyrrole deposited on the anode during electrolysis is washed with a solvent, preferably water or an aqueous solvent, to remove adhering conductive salt, and is dried at from 25° to 150° C., preferably under reduced pressure. When inert electrodes are used, e.g. electrodes made of a noble metal, steel, titanium, nickel or the like, the polypyrrole film can then in general be easily detached from the electrode, especially when a layer more than 20 μm thick has been deposited. The resulting films are self-supporting and stable and possess good mechanical properties and strengths and a well-formed surface.

Instead of self-supporting films, it is just as possible to use the novel process to prepare film coatings or layers of the polypyrroles in conjunction with a substrate, for example a metal foil or a graphite layer. To do this, for example, this substrate is used as the anode, and the polypyrrole film deposited on this is left on the substrate when electrolysis is complete. In this manner, it is possible, in particular, to produce very thin coatings, for example a few μm thick, and hence to modify the surface of the substrate.

The polypyrrole films prepared according to the invention possess a high electrical conductivity generally above $10^{-2}\Omega^{-1}cm^{-1}$, in particular above $10^{-1}\Omega^{-1}cm^{-1}$, very good mechanical properties and stability to chemical attack or physical load. The electrical conductivity is measured by the two-point or four-point method. The p-conductive polypyrroles prepared according to the invention contain the anion of the conductive salt used in their preparation, so that the properties of the resulting polypyrroles are also determined by the type of conductive salt or salts used. If the intention is further to increase or improve the electrical conductivity of the polypyrroles prepared according to the invention, it is fully possible to treat them in a conventional manner, in the gas phase or in solution, with the conventional dopants, e.g. AsF$_5$, SbF$_5$, SbCl$_5$, etc. However, such a subsequent, additional doping of the novel polypyrroles to increase the electrical conductivity is usually unnecessary. Polypyrroles which contain aromatic comonomers as copolymerized units can also be converted from a p-conductive system to an n-conductive one, this being achieved most readily by an electrochemical method.

The polypyrroles prepared according to the invention can advantageously be used in any field in which polypyrroles are conventionally employed, for example for the production of catalysts, electrical switches, semiconductor components, electrodes or screening materials, or for the antistatic treatment of plastics.

The Examples which follow illustrate the invention. Parts and percentages are by weight, unless stated otherwise.

EXAMPLES 1 TO 10

All of the Examples were carried out in a flow-through electrolysis cell having a capacity of 100 ml. The electrodes used were two platinum sheets, and these were attached parallel to one another and 1.0 cm apart. Each platinum sheet was 1 mm thick and had a polished surface with an area of 10 cm$^2$. The electrolyte system consisted of 1.84 g of pyrrole, 370 ml of water and 3.5 g of the particular conductive salt shown in the Table below, and was pumped through the electrolysis cell to carry out the electrochemical polymerization. The electrolysis was carried out at room temperature, using a current of 324 Coulomb and a current density of 7.5 mA/cm$^2$. After 20 minutes, the electrolysis was interrupted, and the resulting black polypyrrole film was detached from the anode, washed and dried. In every case, the film obtained was mechanically stable and had a smooth, homogeneous surface; the electrical conductivities of the films are also shown in the Table below.

TABLE

| Example | Conductive salt Anion | Counter-ion | Electrical conductivity [Ohm$^{-1}$cm$^{-1}$] |
|---|---|---|---|
| 1 | naphthalene-SO$_3^-$ | N(C$_4$H$_9$)$_3$H$^+$ | 16.4 |
| 2 | H$_2$N–C$_6$H$_4$–SO$_3^-$ | N(C$_4$H$_9$)$_3$H$^+$ | 0.2 |
| 3 | C$_6$H$_5$–CH$_2$–NH–C$_6$H$_4$–SO$_3^-$ | N(C$_4$H$_9$)$_3$H$^+$ | 0.2 |

TABLE-continued

| Example | Conductive salt Anion | Counter-ion | Electrical conductivity [Ohm$^{-1}$cm$^{-1}$] |
|---|---|---|---|
| 4 | 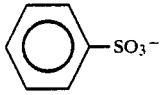 | N(C$_4$H$_9$)$_3$H$^+$ | 28 |
| 5 | 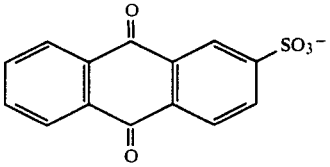 | Na$^+$ | 17 |
| 6 | 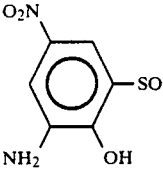 | Na$^+$ | 0.6 |
| 7 | 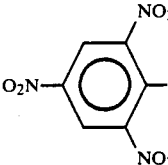 | K$^+$ | 0.9 |
| 8 | 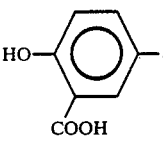 | Na$^+$ | 12 |
| 9 | 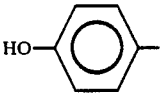 | N(C$_2$H$_5$)$_3$H$^+$ | 15 |
| 10 | 2-(4-sulfophenylazo)-chromotropic acid | Na$^+$ | 25 |

We claim:

1. A process for the preparation of a polypyrrole film having a homogeneous surface and having an electrical conductivity above 10$^2$Ω$^{-1}$cm$^{-1}$ by anodic oxidation of pyrrole or a mixture of pyrrole with comonomers in a water-containing electrolyte solvent in the presence of a conductive salt, with deposition of the polypyrrole on the anode, wherein the electrochemical anodic oxidation is carried out in an aqueous electrolyte solvent which consists of not less than 50% by weight of water, aromatic sulfonic acids and/or their salts being used as conductive salts.

2. A process as claimed in claim 1, wherein the electrolyte solvent consists of not less than 80% by weight of water.

3. A process as claimed in claim 1, wherein the conductive salt used is an alkali metal salt of an aromatic sulfonic acid.

4. A process as claimed in claim 1, wherein the conductive salt used is a nitrogen or phosphorus onium salt of an aromatic sulfonic acid.

5. A process as claimed in claim 1, wherein the aromatic sulfonic acid is benzene, a fused aromatic ring system or a polynuclear quinone having one or more sulfonic acid groups in the molecule.

6. A process as claimed in claim 1, wherein the aromatic sulfonic acid carries one or more further substituents.

7. A process as claimed in claim 1, wherein the aromatic sulfonic acid used is polystyrenesulfonic acid having a mean molecular weight of from 500 to 20,000 and containing from 1 to about 35 sulfonic acid groups per 100 styrene units.

8. A process as claimed in claim 1, wherein, in addition to the aromatic sulfonic acids and/or their salts, other conventional conductive salts are concomitantly used in an amount of not more than 50% by weight, based on the total amount of conductive salts employed.

9. A process as claimed in claim 1, wherein a pyrrole/comonomer mixture is employed which contains as much as 25% by weight, based on the total monomer mixture, of comonomers.

* * * * *